US 011387289B2

(12) United States Patent
Qin et al.

(10) Patent No.: US 11,387,289 B2
(45) Date of Patent: Jul. 12, 2022

(54) ARRAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventors: Yunke Qin, Beijing (CN); Xue Dong, Beijing (CN); Zhifu Li, Beijing (CN); Haisheng Wang, Beijing (CN); Yingming Liu, Beijing (CN); Yuzhen Guo, Beijing (CN); Pinchao Gu, Beijing (CN); Lin Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 381 days.

(21) Appl. No.: 16/475,105

(22) PCT Filed: Dec. 25, 2018

(86) PCT No.: PCT/CN2018/123463
§ 371 (c)(1),
(2) Date: Jun. 30, 2019

(87) PCT Pub. No.: WO2019/165835
PCT Pub. Date: Sep. 6, 2019

(65) Prior Publication Data
US 2021/0335915 A1 Oct. 28, 2021

(30) Foreign Application Priority Data
Feb. 27, 2018 (CN) .......................... 201810165170.3

(51) Int. Cl.
H01L 27/32 (2006.01)
H01L 27/28 (2006.01)
(Continued)

(52) U.S. Cl.
CPC ........ *H01L 27/3225* (2013.01); *H01L 27/288* (2013.01); *H01L 27/3227* (2013.01);
(Continued)

(58) Field of Classification Search
CPC ............... H01L 27/3225; H01L 27/288; H01L 27/3227; H01L 27/3234; H01L 27/3246;
(Continued)

(56) References Cited

U.S. PATENT DOCUMENTS

2014/0299879 A1 10/2014 Yamazaki
2018/0130857 A1* 5/2018 Lee ..................... H01L 27/3276
(Continued)

FOREIGN PATENT DOCUMENTS

CN 103887324 A 6/2014

OTHER PUBLICATIONS

International Search Report in Application No. PCT/CN2018/123463, dated Mar. 29, 2019.
(Continued)

*Primary Examiner* — David Vu
*Assistant Examiner* — Brandon C Fox
(74) *Attorney, Agent, or Firm* — Syncoda LLC; Feng Ma

(57) ABSTRACT

An array substrate includes a substrate, a packaging layer, and at least one sensor. The packaging layer is over the substrate. Each sensor includes a sensing thin-film transistor and a sensing unit, electrically coupled with each other. The sensing thin-film transistor is between the package layer and the substrate, and the sensing unit is over a side of the package layer away from the substrate. The array substrate can also include a plurality of display thin-film transistors. The sensing thin-film transistor in each sensor can be at substantially same film layers, or of a same structure and a same type, as each display thin-film transistor.

18 Claims, 10 Drawing Sheets

(51) Int. Cl.
   *H01L 51/52*    (2006.01)
   *H01L 51/56*    (2006.01)
(52) U.S. Cl.
   CPC ...... *H01L 27/3234* (2013.01); *H01L 27/3246* (2013.01); *H01L 51/5253* (2013.01); *H01L 51/56* (2013.01); *H01L 27/3211* (2013.01); *H01L 2227/323* (2013.01)
(58) Field of Classification Search
   CPC ............. H01L 51/5253; H01L 51/56; H01L 2227/323
   USPC .......................................................... 257/43
   See application file for complete search history.

(56) References Cited

U.S. PATENT DOCUMENTS

| | | | |
|---|---|---|---|
| 2018/0210571 A1* | 7/2018 | Wang | G06F 3/042 |
| 2018/0357964 A1* | 12/2018 | Shin | H01L 27/3265 |
| 2019/0006441 A1* | 1/2019 | Ling | H01L 27/3265 |
| 2019/0332212 A1* | 10/2019 | Kim | G06F 3/04144 |
| 2021/0042493 A1* | 2/2021 | Lius | G09G 3/3208 |

OTHER PUBLICATIONS

CN Second Office Action in Application No. 201810165170.3, dated Sep. 24, 2020.

* cited by examiner

ARRAY SUBSTRATE, MANUFACTURING METHOD THEREOF, AND DISPLAY APPARATUS

CROSS-REFERENCE TO RELATED APPLICATION

The present application claims priority to Chinese Patent Application No. CN 201810165170.3 filed on Feb. 27, 2018, the disclosure of which is hereby incorporated by reference in its entirety.

TECHNICAL FIELD

The disclosure relates generally to the field of display technologies, and more specifically to an array substrate, its manufacturing method, and a display apparatus containing the array substrate.

BACKGROUND

The touch control function has become a basic configuration of a display apparatus, which is especially the case in the field of consumer electronics, such as mobile phones and computers. With the development of Internet of things (IoTs) and artificial intelligence, it is going to be a trend to confer more functionalities to a display apparatus.

SUMMARY

In a first aspect, the present disclosure provides an array substrate.

The array substrate comprises a substrate, a packaging layer over the substrate, and at least one sensor, each comprising a sensing thin-film transistor and a sensing unit electrically coupled with each other. The sensing thin-film transistor is arranged between the package layer and the substrate; and the sensing unit is arranged over a side of the package layer away from the substrate.

According to some embodiments, the array substrate can further include a plurality of display thin-film transistors, wherein the sensing thin-film transistor in the each of the at least one sensor is arranged at substantially same film layers as each of the plurality of display thin-film transistors.

Herein, optionally, the sensing thin-film transistor in the each of the at least one sensor is of a substantially same structure and of a substantially same type as each of the plurality of display thin-film transistors.

According to some other embodiments, the array substrate can further include a plurality of display thin-film transistors, wherein the sensing thin-film transistor in the each of the at least one sensor is arranged at different film layers as each of the plurality of display thin-film transistors.

According to some embodiments of the array substrate, the sensing thin-film transistor in the each of the at least one sensor comprises an oxide thin-film transistor, and each of the plurality of display thin-film transistors comprises a low-temperature polysilicon thin-film transistor.

The array substrate can further include a passivation layer; a second electrode layer; a pixel defining layer; and a first electrode layer, which are sequentially over a side of the plurality of display thin-film transistors and the sensing thin-film transistor in the each of the at least one sensor away from the substrate and below the packaging layer.

Optionally, at least one first via is arranged in the pixel defining layer and the first electrode layer, corresponding to the at least one sensor respectively. At least one second via is arranged in the passivation layer, corresponding to the at least one first via respectively. Each of the at least one second via forms a via-in-via structure inside a corresponding first via; and the sensing unit and the sensing thin-film transistor in the each of the at least one sensor are electrically coupled to each other through one of the at least one second via corresponding thereto.

Furthermore, each of the at least one first via and a corresponding second via can be configured to have a common axis.

According to some embodiments, each of the at least one first via and a corresponding second via is configured to extend through the passivation layer such that a direct electrical connection between a sensing unit and a sensing thin-film transistor of a corresponding sensor is realized.

In the array substrate, the second electrode layer can comprise at least one connecting electrode corresponding to the at least one sensor respectively. Each of the at least one connecting electrode is electrically coupled with a sensing thin-film transistor in a corresponding sensor through a third via in the passivation layer. Each of the at least one first via and a corresponding second via is configured to allow an electrical connection between a sensing unit in a corresponding sensor and a corresponding connecting electrode.

According to some embodiments of the array substrate, the packaging layer comprises a thin film encapsulation (TFE) layer.

In the array substrate, the sensing unit of the each of the at least one sensor can comprise a third electrode, an active portion, and a fourth electrode, which are sequentially disposed over a side of the passivation layer distal to the substrate, and the third electrode can be electrically coupled to the sensing thin-film transistor in the each of the at least one sensor.

Herein, optionally, an orthographic projection of the third electrode on the substrate and an orthographic projection of the fourth electrode on the substrate can stagger from each other.

Furthermore, the orthographic projection of the third electrode on the substrate and the orthographic projection of the fourth electrode on the substrate can optionally take a cross-finger shape.

According to some embodiments of the array substrate, the sensing unit in the each of the at least one sensor is transparent.

Herein, optionally, the sensing unit in the each of the at least one sensor can be arranged in an area overlapping with a pixel area.

According to some embodiments of the array substrate, a sensing unit in one or more of the at least one sensor can be non-transparent, and can be arranged in a non-pixel area.

In a second aspect, the present disclosure further provides a display apparatus, which comprises an array substrate according to any one of the embodiments of the array substrate as described above.

In a third aspect, the present disclosure further provides a method for manufacturing an array substrate, which comprises the following steps:

forming at least one sensing thin-film transistor over a substrate;

forming a packaging layer over a side of the at least one sensing thin-film transistor distal to the substrate; and forming at least one sensing unit over a side of the packing layer distal to the substrate, wherein each of the at least one sensing unit is electrically coupled to one of the at least one sensing thin-film transistor corresponding thereto to thereby form one sensor.

According to some embodiments of the method, the step of forming at least one sensing thin-film transistor over a substrate comprises:

forming the at least one sensing thin-film transistor and a plurality of display thin-film transistors simultaneously over the substrate.

According to some other embodiments of the method, the step of forming at least one sensing thin-film transistor over a substrate comprises:

forming the at least one sensing thin-film transistor and a plurality of display thin-film transistors separately over the substrate.

BRIEF DESCRIPTION OF DRAWINGS

In order to clearly illustrate various embodiments provided in the present disclosure, the following are drawings that accompany the description of the embodiments.

It is noted that these drawings shall be interpreted to serve illustrating purposes only, and that these drawings may represent just some, but not all, of embodiments of the present disclosure. For those skilled in the art, other embodiments that are based on the structures as described below and illustrated in these drawings may become obvious. As such, these other embodiments shall be interpreted to be contained within the scope of the disclosure.

DETAILED DESCRIPTION

Figure 1A:
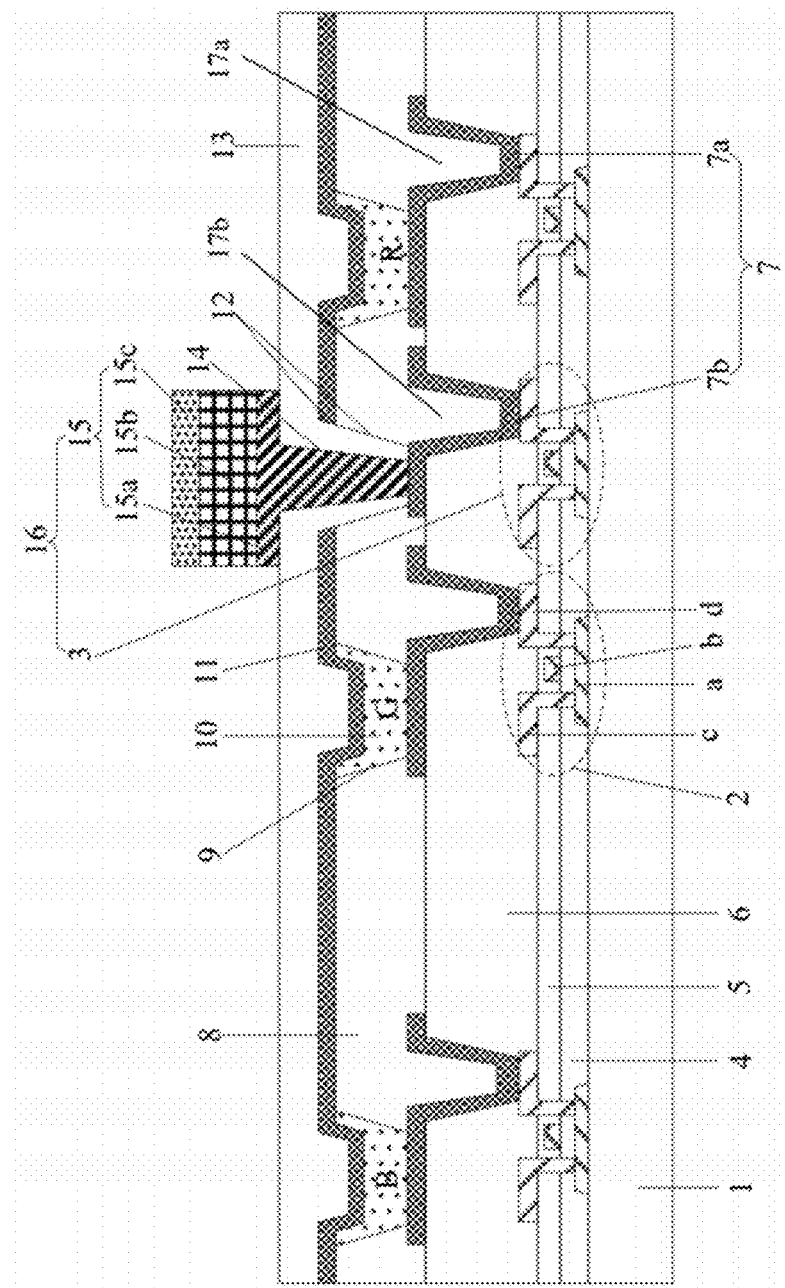
FIG. 1A illustrates a cross-sectional view of an array substrate according to some embodiments of the disclosure.

Currently, it has been a trend to incorporate or integrate one or more sensors of specific functionality in a display panel. Two structures are commonly employed in an existing display panel.

A first related employed structure is an In-Cell structure, where a sensing thin-film transistor and a sensing unit of a sensor are both arranged between a packaging layer and a substrate of an array substrate. Yet one disadvantage of this type of structure of the array substrate is that sensors are typically crowdedly arranged in the array substrate, which in turn causes a high level of difficulty in the manufacturing process of the array substrate.

In addition, if the above mentioned array substrate is employed in an organic light-emitting diode (OLED) display panel, the elector luminescence (EL), i.e. the light-emitting layer, of the OLED display panel can only subject to a relatively low temperature, and thus the EL can easily be affected by temperature during the manufacturing process of sensors in the array substrate.

A second related employed structure is an Out-Cell structure, where a thin film transistor and a sensing unit of a sensor are both arranged over a side of a packaging layer that is distal to or away from a substrate of an array substrate. One disadvantage of such a structure is that the display panel containing the Out-Cell structure has a relatively high thickness.

In light of these above two structures for arranging sensors in the array substrate of a display panel, the present disclosure provides an array substrate having a structure differing from the two related structures.

In the array substrate disclosed herein, a sensing thin-film transistor of the sensor can be arranged between the package layer and the substrate of the array substrate, whereas a sensing unit of the sensor can be arranged over a side of the package layer distal to, or facing away from, the substrate.

As such, one portion of the sensor is substantially embedded inside the array substrate of the display panel, and another portion of the sensor is arranged outside the array substrate, thereby forming a Half-In-Cell structure.

On the one hand, this type of structure disclosed herein can increase the space for configuring sensors in the array substrate of the display panel compared with the above mentioned In-Cell structure of the array substrate, in turn reducing the difficulty in manufacturing the array substrate. On the other hand, the overall thickness of the array substrate can be reduced compared with the above mentioned Out-Cell structure of the array substrate.

The above is the main gist for the invention disclosed herein. In the following, with reference to the drawings illustrated for the various embodiments of the disclosure, a description of the various aspects of the invention will be provided in detail.

Apparently, the embodiments to be described represent only part, but not all, of the embodiments in the present disclosure. The present disclosure can also be implemented or applied through different specific embodiments, and various details of the specification can also be modified or changed based on different viewpoints and applications without departing from the main gist of the disclosure.

In a first aspect, an array substrate is provided.

FIG. 1A illustrates a cross-sectional view of an array substrate according to some embodiments of the disclosure. As shown, the array substrate includes a substrate 1, a packaging layer 13, and at least one sensor 16. The packaging layer 13 is arranged over one side of the substrate 1, i.e., the substrate 1 and the packaging layer 13 are opposingly arranged to face each other.

Each of the at least one sensor 16 comprises a thin-film transistor 3 for sensing purposes (i.e. sensing thin-film transistor hereafter), and a sensing unit 15 electrically coupled with the sensing thin-film transistor 3. The sensing thin-film transistor 3 is arranged over a surface of the packaging layer 13 proximal to, or facing, the substrate 1, whereas the sensing unit 15 is arranged over a surface of the packaging layer 13 distal to, or facing away from, the substrate 1. The packaging layer 13 can be, for example, a thin-film packaging layer.

By means of the above structure, one portion of the sensor 16 (i.e. the sensing thin-film transistor 3) is embedded inside the array substrate, or more specifically embedded between the substrate 1 and the packaging layer 13, whereas another portion of the sensor 16 (i.e. the sensing unit 15) is arranged outside the array substrate. Thereby a Half-In-Cell structure is formed in the array substrate.

Compared with the In-Cell structure of an array substrate based on an related technology where all portions of the sensor are arranged between the substrate and the packaging layer of the array substrate, the Half-In-Cell structure can increase a space for configuring sensor(s) in an array substrate, in turn resulting in a reduced difficulty in manufacturing the array substrate.

Compared with the Out-Cell structure of an array substrate based on another related technology where all portions of the sensor are arranged over one side of the packaging layer opposing to the substrate, the Half-In-Cell structure can help reduce a thickness of an array substrate having sensor(s) integrated therein.

With further reference in FIG. 1A, in each of the at least one sensor 16, the sensing thin-film transistor 3 is configured to control a switch of the each of the at least one sensor 16 and to read induction signals. The sensing thin-film transistor 3 can be arranged at substantially same film layers as thin-film transistors 2 for display purposes (i.e. display thin-film transistors hereafter) in the array substrate, so as to further increase the space of configuring the sensor(s), as also illustrated in FIG. 1A. The sensing thin-film transistor 3 in each of the at least one sensor 16 can also be arranged at different film layers as display thin-film transistors according to some other embodiments of the array substrate.

Each of the display thin-film transistor 2 and the sensing thin-film transistor 3 includes an active layer a, a gate electrode b, a source electrode c and a drain electrode d. The active layer a and the gate electrode b are separated, and insulated from each other, by a first insulating layer 4. The source electrode c and the gate electrode b, the drain electrode d and the gate electrode b are both insulated from one another by a second insulating layer 5.

It is noted that in the above embodiments of the array substrate illustrated in FIG. 1A, each of the display thin-film transistor 2 and the sensing thin-film transistor 3 has a top-gate structure, which serves only as an illustrating example and does not impose a limitation to the scope of the disclosure. A bottom-gate structure, or a structure of another type, can also be employed for forming each of the display thin-film transistor 2 and the sensing thin-film transistor 3 in the array substrate.

Herein, as illustrated in FIG. 1A, a plurality of display thin-film transistors 2 are included in the array substrate to realize a display function for the display panel. Each of the plurality of display thin-film transistors 2 is arranged between the substrate 1 and the packaging layer 13.

It is further noted that in addition to the embodiments illustrated in FIG. 1A where the sensing thin-film transistor 3 in each of the at least one sensor 16 and each of the plurality of display thin-film transistors 2 are arranged at substantially same film layers in the array substrate to have a relatively simple layered structure, the sensing thin-film transistor 3 and each of the plurality of display thin-film transistors 2 can also be arranged at different film layers in the array substrate.

In the embodiments of the array substrate disclosed herein and illustrated in FIG. 1A, because the sensing thin-film transistor 3 in each of the at least one sensor 16 (i.e. each sensing thin-film transistor 3) and each of the plurality of display thin-film transistors 2 are arranged at substantially same film layers, each sensing thin-film transistor 3 and each of the plurality of display thin-film transistors 2 can be configured to have a substantially same structure and can be of a same type, so as to allow the simultaneous manufacturing of each sensing thin-film transistor 3 and each display thin-film transistors 2 to realize a simplified manufacturing process.

However, it is noted that each sensing thin-film transistor 3 and each of the plurality of display thin-film transistors 2 can also be manufactured separately according to some other embodiments of the disclosure. Accordingly, one or a combination of thin-film transistor manufacturing processes can be applied, and as such each sensing thin-film transistor 3 and each display thin-film transistor 2 needs to be flexibly designed.

Optionally, each of the at least one sensor 16 can include more than one sensing thin-film transistor 3.

In these embodiments of the array substrate, each of the more than one sensing thin-film transistor 3 in each sensor 16 can have a substantially same structure, and can be of a same type, thereby allowing a simultaneous manufacturing of the more than one sensing thin-film transistor 3 in each of the at least one sensor 16. However, it is noted that according to some other embodiments of the array substrate, the more than one sensing thin-film transistor 3 can have a different structure, and/or can be of a different type, so as to meet specific requirements for realizing different circuit performances.

The array substrate as described above can be applied in a display panel of a self-luminescence type, such as an organic light-emitting diode (OLED) display panel, a quantum dot light-emitting diode (QLED) display panel, etc. Accordingly, in these types of the display panel, the array substrate further includes other functional elements and film layers.

Specifically, as further illustrated in FIG. 1A, the above embodiments of the array substrate further include a passivation layer 6, a second electrode layer 7, a pixel defining layer 8, a plurality of light-emitting members 10, and a first electrode layer 11, which are all arranged between the film layers for the at least one sensing thin-film transistor 3 and the plurality of display thin-film transistors 2 and the packaging layer 13.

The passivation layer 6 is disposed over a side of the film layers for the at least one sensing thin-film transistor 3 and the plurality of display thin-film transistors 2 that is distal to or away from the substrate 1. The second electrode layer 7 is disposed over a side of the passivation layer 6 that is distal to or away from the substrate 1, and comprises a plurality of second electrodes 7a corresponding respectively to the plurality of the display thin-film transistors 2. Each of the plurality of second electrodes 7a is electrically coupled to a drain electrode d of each of the plurality of display thin-film transistors 2 corresponding thereto through a via 17a arranged in the passivation layer 6.

The pixel defining layer 8 is arranged over a side of the second electrode layer 7 that is distal to or away from the substrate 1. The pixel defining layer 8 is provided with a plurality of openings 9, and each of the plurality of light-emitting members 10 is correspondingly arranged within each of the plurality of openings 9 in the pixel defining layer 8. The first electrode layer 11 is arranged over a side of the pixel defining layer 8 that is distal to or away from the substrate 1. The packaging layer 13 is arranged over a side of the first electrode layer 11 that is distal to or away from the substrate 1.

With regard to each of the plurality of light-emitting members 10, one side surface thereof is configured to electrically connect a corresponding second electrode 7a, and another side thereof is configured to electrically connect the first electrode layer 11, thereby forming a plurality of light-emitting elements (i.e. pixels).

Each of the plurality of light-emitting members 10 has a composition of a light-emitting material capable of emitting lights of a specific color to thereby correspond to a pixel of a same color. In one example, each of the plurality of light-emitting members 10 can have a composition capable of emitting a red light (R), a green light (G), or a blue light (B), to thereby correspond to a red pixel (R), a green pixel (G), or a blue pixel (B).

It is noted that the above mentioned second electrode 7a can be an anode of a light-emitting element, and the above mentioned first electrode layer 11 can be a cathode of the light-emitting element accordingly. The anode and the cathode can be switched.

Each second electrode 7a is electrically coupled with a display thin-film transistor 2 corresponding thereto, so as to realize an electrical connection between a light-emitting element and the corresponding display thin-film transistor 2, further allowing the display thin-film transistor 2 to be able to control a switch of the corresponding light-emitting element. As described above, the electrical connection between each second electrode 7a and its corresponding display thin-film transistor 2 is realized by means of a via 17a provided in the passivation layer 6 and optionally at a position thereof corresponding to the each second electrode 7a.

In the array substrate of a display panel of a self-luminescence type as illustrated in FIG. 1A, in order to realize an electrical connection between a sensing unit 15 of each of the at least one sensor 16 and a corresponding sensing thin-film transistor 3, at least one first via 12 can be configured in the pixel defining layer 8 and the first electrode layer 11. Each of the at least one first via 12 is configured to correspond to one of the at least one sensor 16. Additionally, at least one second via 14 can be configured within the packaging layer 13, and each of the at least one second via 14 is also configured to correspond to one of the at least one sensor 16.

It is further configured such that each first via 12 is configured to be outside of a corresponding second via 14. In other words, an orthographic projection of each first via 12 on the substrate 1 covers an orthographic projection of each second via 14 on the substrate 1. In the embodiments of the array substrate as specifically illustrated in FIG. 1A, each first via 12 and a corresponding second via 14 are configured to have a common axis, and each first via 12 is further configured to have a bigger diameter than its corresponding second via 14, to thereby form a via-in-via structure.

Herein that "each first via 12 and a corresponding second via 14 are configured to have a common axis" is referred to as a configuration where each first via 12 and its corresponding second via 14 both have an axis that is perpendicular to a plane of the substrate 1. However, it is noted that according to some other embodiments, each first via 12 and a corresponding second via 14 do not have a common axis but still form a via-in-via structure.

Herein the diameter of a via (i.e. a first via 12 or a second via 14) is defined as a diameter of a circle formed in a cross section of the via in a plane that is in parallel with a plane of the substrate 1. As such, that "each first via 12 is further configured to have a bigger diameter than its corresponding second via 14" is referred to as a configuration where a cross section of each first via 12 has a shape of a first circle, and a cross section of its corresponding second via 14 has a shape of a second circle, and a diameter of the first circle is bigger than a diameter of the second circle.

By means of the via-in-via structure described above, the sensing unit 15 of each of the at least one sensor 16 can be electrically connected with a corresponding sensing thin-film transistor 3 through a conductive material arranged in a corresponding second via 14. Furthermore, because of the presence of a material for the packaging layer 13 between a first via 12 and a corresponding second via 14, the sensing unit 15 of each of the at least one sensor 16 is electrically insulated from the first electrode layer 11, which can prevent signals from each of the at least one sensor 16 from interfering with signals form any light-emitting element (i.e. pixel).

In the array substrate disclosed herein, an electrical connection between the sensing unit 15 of each of the at least one sensor 16 and a corresponding sensing thin-film transistor 3 can be realized through a direct electrical connection by means of a conductive material in the corresponding second via 14 according to some embodiments of the disclosure, but can also be realized through an indirect electrical connection according to some other embodiments of the disclosure.

On the one hand, the indirect electrical connection between the sensing unit 15 of each of the at least one sensor 16 and a corresponding sensing thin-film transistor 3 can be realized, for example, by configuring a connecting electrode 7b at a substantially same layer as the plurality of second electrode 7a (i.e. the connecting electrode 7b is arranged in the second electrode layer 7), as illustrated in FIG. 1A.

It is further configured such that the at least one connecting electrode 7b and the at least one sensor 16 correspond to one another: each connecting electrode 7b is electrically coupled with a drain electrode of a sensing thin-film transistor 3 in a corresponding sensor 16, and each connecting electrode 7b is further electrically coupled with a sensing unit 15 in the corresponding sensor 16 through a corresponding second via 14. As such, the sensing unit 15 of each sensor 16 can be electrically coupled to a corresponding sensing thin-film transistor 3 of the each sensor 16 through a corresponding second via 14 and a corresponding connecting electrode 7b.

This above manner of electrical connection can effectively avoid the poor quality or even fracture of the film layer(s) around a via where the via has a relatively large depth, which in turn ensures a good signal transmission performance at the electrical connection.

Figure 1B:
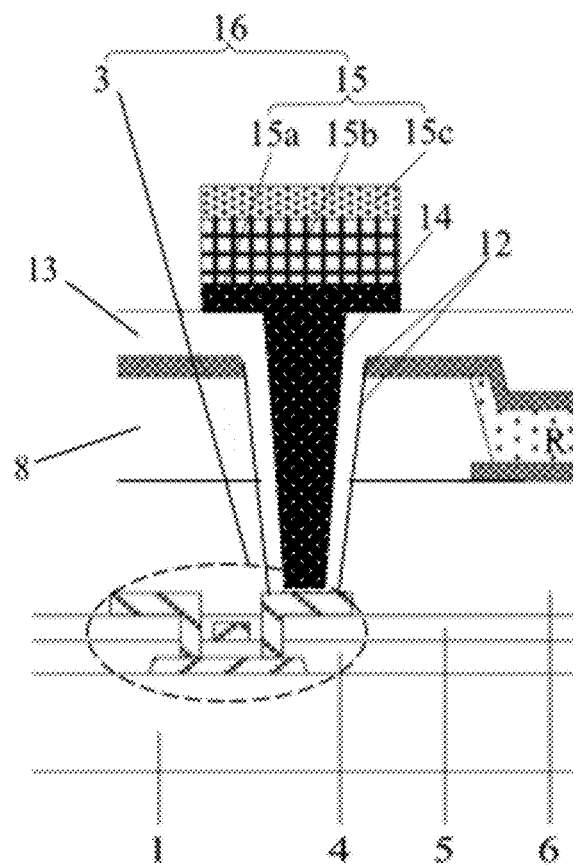
FIG. 1B illustrates a cross-sectional view of a local structure of an array substrate according to some other embodiments of the disclosure.

On the other hand, with reference to FIG. 1B, the direct electrical connection between the sensing unit 15 of each of the at least one sensor 16 and a corresponding sensing thin-film transistor 3 can be realized, for example, by extending a corresponding first via 12 and a corresponding second via 14 further through the passivation layer 6 to expose a drain electrode d of the corresponding sensing thin-film transistor 3 to thereby directly allow an electrical connection between the sensing unit 15 and its corresponding sensing thin-film transistor 3 through a conductive material in the second via 14. It is noted that for conciseness, only the structure of the sensing unit 15 of a sensor 16 and a corresponding sensing thin-film transistor 3 is illustrated in FIG. 1B.

Thus compared with the above mentioned embodiments having indirect electrical connection between the sensing unit 15 of each of the at least one sensor 16 and a corresponding sensing thin-film transistor 3, these embodiments of the array substrate having a direct electrical connection do not need the configuration of a connecting electrode 7b in the second electrode layer 7 to indirectly mediate the electrical connection between the sensing unit 15 of each of the at least one sensor 16 and a corresponding sensing thin-film transistor. Importantly, these embodiments of the array substrate having a direct electrical connection have a relatively low electric resistance, in turn resulting in a relatively small signal loss.

In any of the embodiments of the array substrate described above, a sensing unit 15 of each of the at least one sensor 16 is configured to sense a stimulus from an environment and generate a sensing signal. As illustrated in FIG. 1A, the sensing unit 15 of each sensor 16 can include a third electrode 15a, an active portion 15b, and a fourth electrode 15c.

The third electrode 15a is arranged over a side surface of the packaging layer 13 distal to the substrate 1; the active portion 15b is arranged over a side surface of the third electrode 15a distal to or away from the substrate 1; and the fourth electrode 15c is arranged over a side surface of the active portion 15b distal to or away from the substrate 1. In other words, the third electrode 15a, the active portion 15b, and the fourth electrode 15c are sequentially arranged over a side surface of the packaging layer 13 distal to or away from the substrate 1 along a direction perpendicular to the substrate 1.

In the sensing unit 15 of each of the at least one sensor 16, the third electrode 15a can be electrically coupled to a corresponding sensing thin-film transistor 3, either indirectly through a second via 14 in a via-in-via structure that contacts with a connecting electrode 7b in the second electrode layer 7 (as illustrated in FIG. 1A), or directly through a second via 14 in a via-in-via structure that extends further through the passivation layer 6.

With regard to each sensing unit 15, at least one of the third electrode 15a, the active portion 15b, and the fourth electrode 15c can have a composition of an organic material. If an organic material is employed for the manufacturing of the array substrate, the manufacturing can be realized by a manufacturing process with a relatively low operational temperature, such as ink printing, printing, embossing, spraying, spin coating, or other film forming processes.

Because of this above reason that the manufacturing can be performed at a relatively low temperature if an organic material is employed to form a corresponding structure, it can effectively avoid that the high temperatures during the manufacturing process of the sensing unit 15 causes adverse effects to the light emitting devices (especially to the light emitting member 10, which has poor heat-resistance) under the packaging layer 13. Moreover, compared with other manufacturing processes such as photolithography, ink printing, printing, embossing, spraying, spin coating, or other film forming processes have a relatively lower cost.

It is noted that, each of the third electrode 15a, the active portion 15b and the fourth electrode 15c of each sensing unit 15 can also have a composition of an inorganic material, and there are no specific limitations herein.

Optionally, the fourth electrode 15c of each sensing unit 15 can have a composition of an organic material, such as an organic conductive polymer. One specific example is a conductive polymer of PEDOT:PSS (a high-molecular weight conductive polymer comprising a polymer of 3,4-ethylenedioxythiophene and polystyrene sulfonate).

If the fourth electrode 15c is transparent, then the fourth electrode 15c can take a structure of a whole surface electrode, without the need for patterning to form the layer of the fourth electrode 15c. As such, the film layer structure of the array substrate can be simplified, the number of manufacturing processes can be decreased, and the manufacturing difficulty can also be reduced.

If the fourth electrode 15c is not transparent, the film layer in the fourth electrode 15c needs to be patterned. It is configured such that the fourth electrode 15c formed by the patterning is arranged in a non-pixel area of the array substrate so as to avoid blocking the pixel area.

Optionally, the third electrode 15a of each sensing unit 15 can have a composition of a metal oxide semiconductor conductive material, such as indium tin oxide (ITO) or a metal. Thereby, the contact resistance between the third electrode 15a and its corresponding connecting electrode 7b or the drain electrode d of it corresponding sensing thin-film transistor 3 can be reduced, in turn causing a reduced signal loss.

Moreover, if the layer of the third electrode 15A needs to be patterned, it is more convenient for the layer to be patterned by using a metal oxide semiconductor conductive material or a metal.

It is noted that when a plurality of sensors 16 are integrated in the array substrate, the plurality of sensors 16 requires non-interference with one another, and thus patterning is required for the layer of the third electrode 15a. Additionally, if the third electrode 15a is not transparent, the layer of the third electrode 15a needs to be patterned as well. As such, the third electrode 15a formed by the patterning needs to be arranged on a non-pixel area of the array substrate, so as to avoid interferences among the plurality of sensors 16 and to avoid blocking of pixel areas.

In any of the embodiments of the array substrate described above, at least one sensor of different functionalities can be integrated in the array substrate, which can include active portions of different compositions. Examples of the at least one sensor include a fingerprint sensor, a pressure sensor, and an optical sensor, etc.

In one illustrating example, a fingerprint sensor can be integrated in the array substrate, where the active portion 15b can comprise a photosensitive material that is sensitive to infrared or near infrared lights.

In another illustrating example, a pressure sensor can be integrated in the array substrate, where the active portion 15b can comprise a piezoelectric material or a piezoresistive material, such as polyvinylidene fluoride (PVDF) and quantum channel complex (QTC).

In yet another illustrating example, an optical sensor can be integrated in the array substrate, where the active portion 15b can comprise a photosensitive material that is sensitive to visible lights to realize sensing of the intensity the visible lights in the environment.

In addition, if the composition of the active portion 15b of a sensor 16 is transparent, there is no limitation to the specific locations where the active portion 15b of the sensor 16 is arranged. It can be arranged at a pixel area or a non-pixel area of the array substrate. On the other hand, however, if the composition of the active portion 15b of a sensor 16 is not transparent, it can only be arranged at a non-pixel area of the array substrate so as to avoid the blocking to the pixel area.

It is noted that in the array substrate disclosed herein, any of the third electrode 15a, the active portion 15b, or the fourth electrode 15c can comprise one film layer, or can comprise multiple film layers.

As further illustrated in FIG. 1A, the sensing unit 15 of each of the at least one sensor 16 can be configured to have a sandwiched structure according to some embodiments of the disclosure. In other words, along a direction perpendicular to the substrate 1, the third electrode 15a, the active portion 15b, and the fourth electrode 15c are sequentially stacked over one another, and they are further configured such that an orthographic projection of the third electrode 15a on the substrate 1 overlaps with an orthographic projection of the fourth electrode 15c on the substrate 1, and that an orthographic projection of the active portion 15b on the substrate 1 overlaps with each of the third electrode 15a and the fourth electrode 15c on the substrate 1.

Figure 2A:
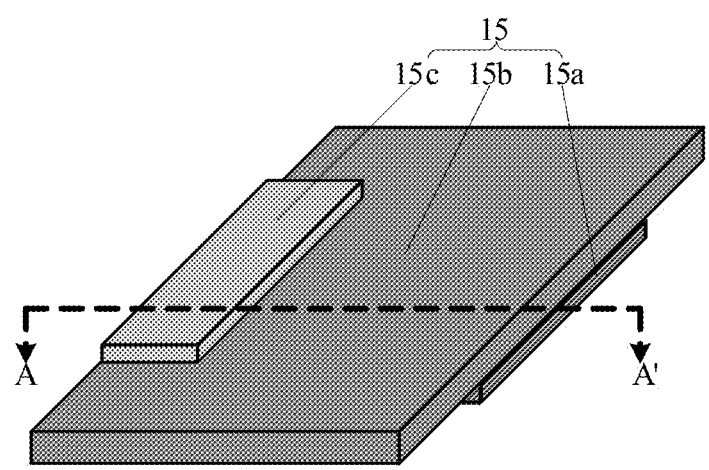
FIG. 2A illustrates a three-dimensional view of a sensing unit of an array substrate according to some embodiments of the disclosure.
Figure 2B:
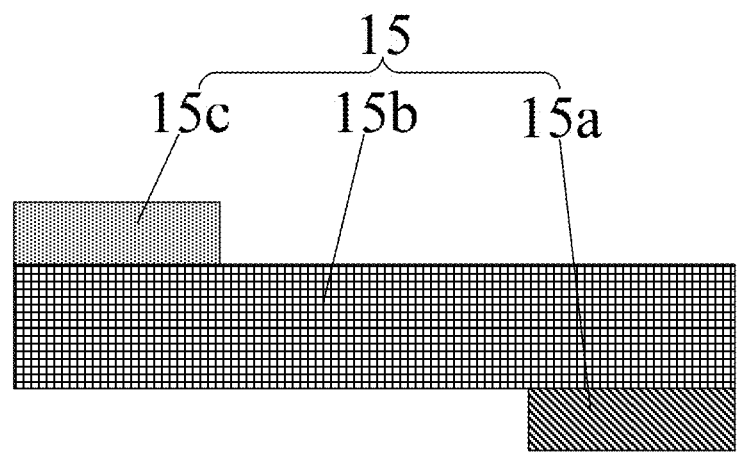
FIG. 2B illustrates a cross-sectional view of the sensing unit as shown in FIG. 2A along an AA' line.

The sensing unit 15 of each of the at least one sensor 16 can have other structures. FIG. 2A illustrates a three-dimensional view of a sensing unit of an array substrate according to some embodiments of the disclosure. FIG. 2B illustrates a cross-sectional view of the sensing unit along an AA' line as shown in FIG. 2A. As shown in the two figures, an orthographic projection of the third electrode 15a on the substrate 1 and an orthographic projection of the fourth electrode 15c on the substrate 1 stagger from each other.

Figure 3:
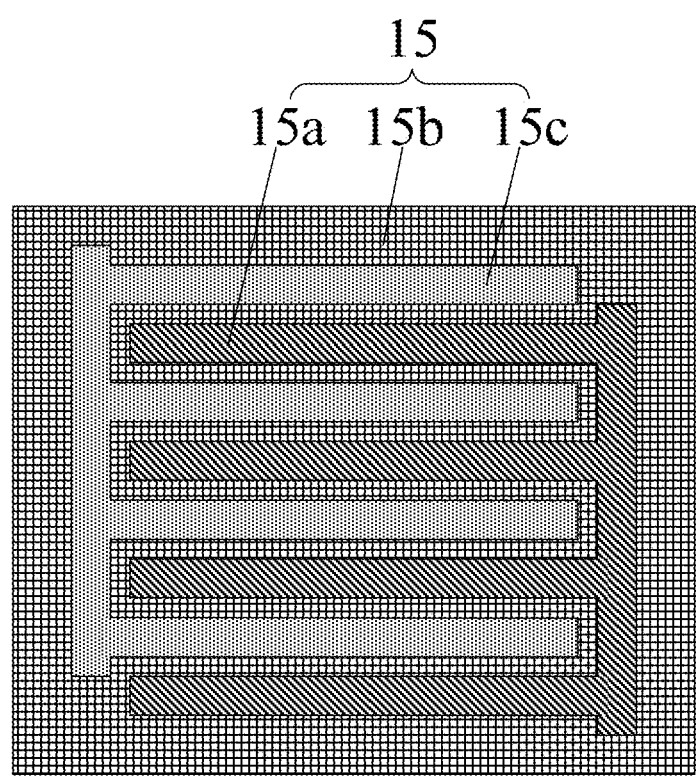
FIG. 3 illustrates an orthographic projection of a sensing unit of an array substrate on a plane that is in parallel to a substrate according to some other embodiments of the disclosure.

On the basis of the above structure, the third electrode 15a and the fourth electrode 15c can each be configured to have a comb-like shape, and are further configured such that the orthographic projections of the third electrode 15a and of the fourth electrode 15c on the substrate 1 take a cross-finger shape to thereby increase the contact area between the active part 15b and each of the third electrode 15a and the fourth electrode 15c, as shown in FIG. 3.

Herein, as well as throughout the disclosure, a pixel area is referred to as an area in each of the sub-pixels configured for normal display. In the embodiments as illustrated in FIG. 1A, the pixel area is substantially the area of the array substrate where a light-emitting member 10 is arranged. A non-pixel area is referred to as an area in each of the sub-pixels that is not for display, such as a gap region between sub-pixels, or an edge region, etc.

In a second aspect, the present disclosure further provides a method for manufacturing an array substrate (i.e. array substrate manufacturing method).

Figure 4:
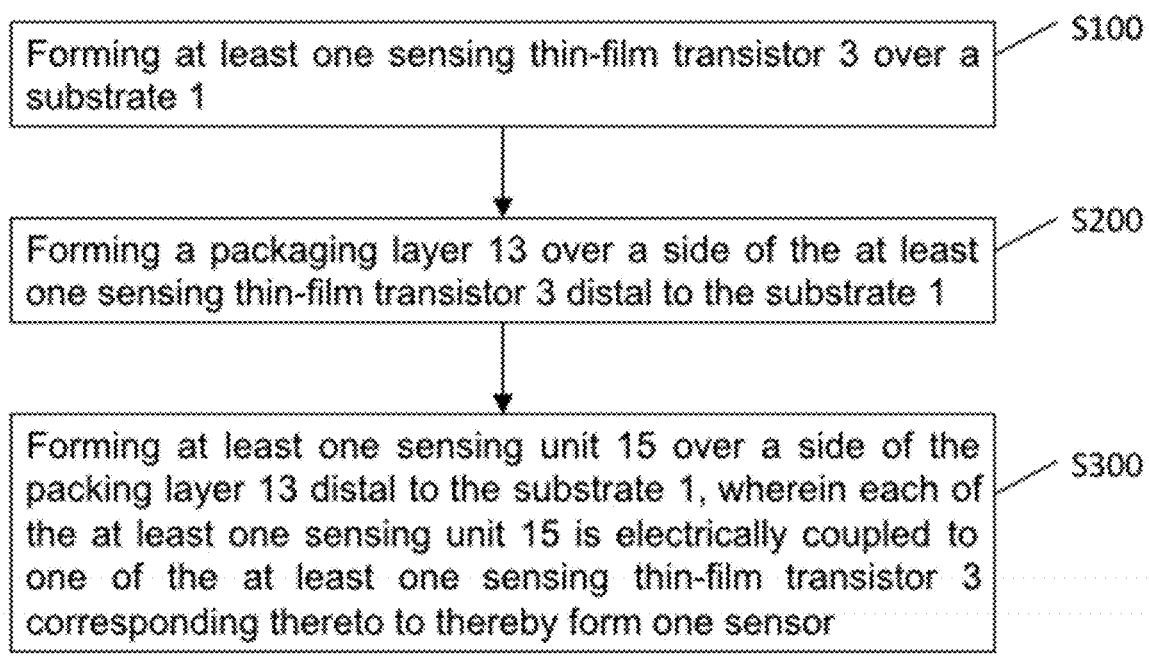
FIG. 4 is a flow chart of a method for manufacturing an array substrate according to some embodiments of the disclosure.

FIG. 4 illustrates array substrate manufacturing method according to some embodiments of the disclosure. As shown in the figure, the array substrate manufacturing method comprises the following steps S100-S300, and the various intermediate product after each step of the array substrate manufacturing method is respectively illustrated in each of FIGS. 5A-5G.

Figure 5A:
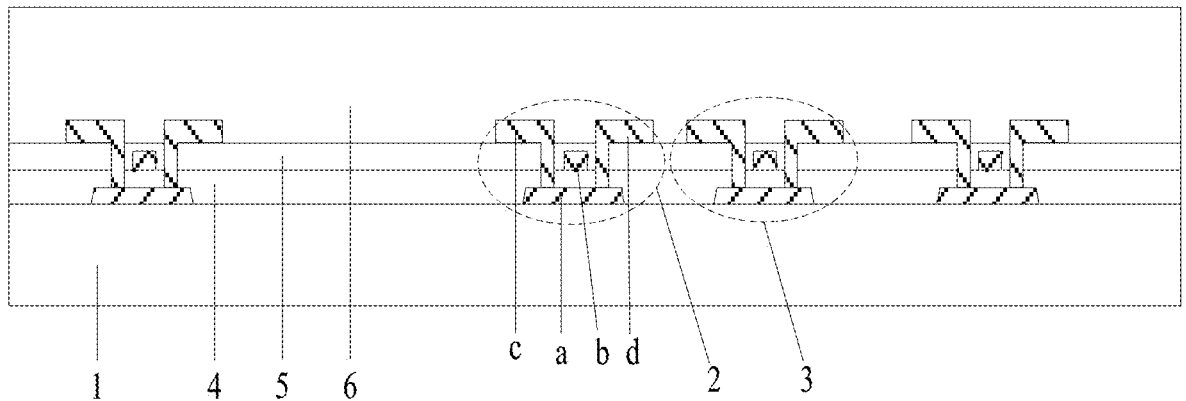
FIGS. 5A-5G illustrate an intermediate product after each step of a method for manufacturing an array substrate according to some embodiments of the disclosure.

S100: forming at least one sensing thin-film transistor 3 over a substrate 1 (the intermediate product after this step is illustrated in FIG. 5A).

Optionally, step S100 further comprises:

Forming a plurality of display thin-film transistor 2 over the substrate 1 (the intermediate product after this embodiments of the step is also illustrated in FIG. 5A).

According to some embodiments, the at least one sensing thin-film transistor 3 and the plurality of display thin-film transistors 2 are manufactured at a same time. For example, each of the at least one sensing thin-film transistor 3 and each of the plurality of display thin-film transistors 2 can both be a low-temperature polysilicon thin-film transistor having a top-gate structure, an oxide thin-film transistor having a top-gate structure, a low-temperature polysilicon thin-film transistor having a bottom-gate structure, an oxide thin-film transistor having a bottom-gate structure, etc.

Due to the fact that each of the at least one sensing thin-film transistor 3 and each of the plurality of display thin-film transistors 2 are of a same type and structure, they can be manufacture in a substantially same step, which can simplify the manufacturing process and reduce the complexity of the film layer being manufactured.

According to some other embodiments, the at least one sensing thin-film transistor 3 can be manufactured at a step that is independent from the plurality of display thin-film transistors 2, so as to meet the special requirements for certain features. For example, in the array substrate, each of the plurality of display thin-film transistors 2 has a requirement for relatively better signal transmission, and as such, can employ a low-temperature polysilicon thin-film transistor. On the other hand, relative to a display thin-film transistor 2, each of the at least one sensing thin-film transistor 3 has a requirement for a relatively smaller off-state current and a relatively higher signal-noise ratio, and as such, it can employ an oxide thin-film transistor.

Due to the different types of each of the plurality of display thin-film transistors 2 and each of the at least one sensing thin-film transistor 3, the at least one sensing thin-film transistor 3 and the plurality of display thin-film transistors 2 can be manufactured at a separate step.

According to yet some other embodiments, each of the at least one sensing thin-film transistor 3 and each of the plurality of display thin-film transistors 2 have a substantially same portion in structure, i.e. share some film layer(s). As such, manufacturing of the film layer(s) shared by the at least one sensing thin-film transistor 3 and the plurality of display thin-film transistors 2 can be carried out at a same manufacturing step, whereas manufacturing of other film layer(s) can be realized by a separate step. Thereby, the manufacturing process can be simplified.

Figure 5B:
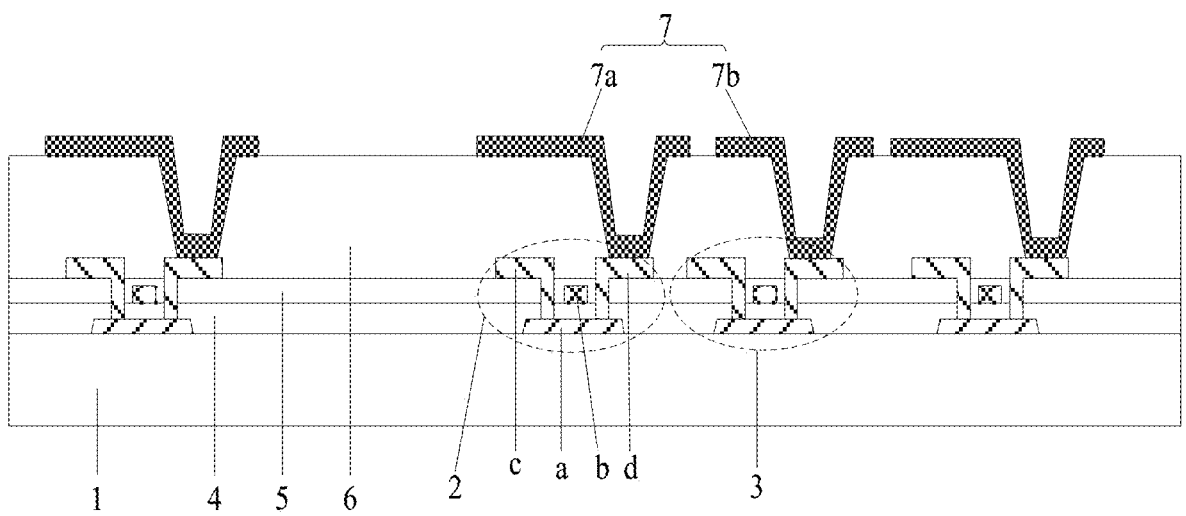

Optionally, after step S100, the method can further include the following steps:

S110: forming a second electrode layer 7 over a side of the plurality of display thin-film transistors 2 distal to the substrate 1; and performing a patterning process to the second electrode layer 7 to form a plurality of second electrodes 7a, wherein each of the plurality of second electrodes 7a is electrically connected to one of the plurality of display thin-film transistors 2 corresponding thereto (the intermediate product after this embodiments of the step is also illustrated in FIG. 5B).

Optionally, during the same step of performing a patterning process to the second electrode layer 7 to form a plurality of second electrodes 7a in S1-2-1, at least one connecting electrode 7b can be formed simultaneously, wherein each of the at least one connecting electrode 7b is electrically coupled with one of the at least one sensing thin-film transistor 3 corresponding thereto.

Figure 5C:
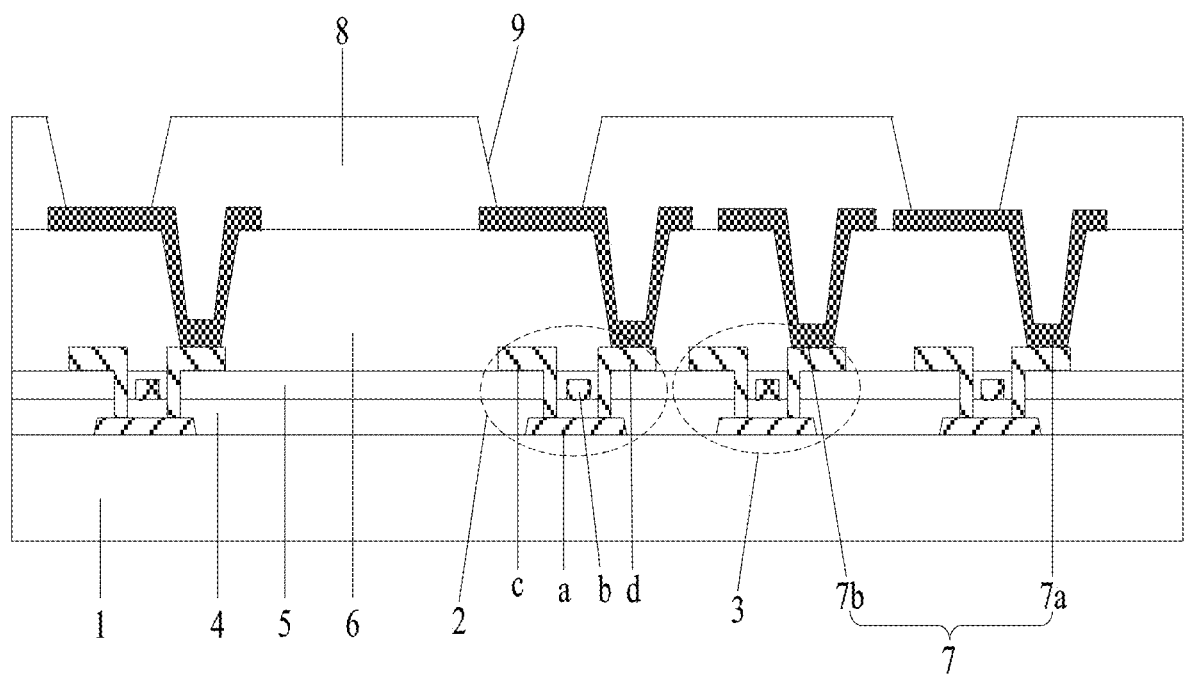

S120: forming a pixel defining layer 8 over a side of the second electrode layer 7 distal to the substrate 1, and performing a patterning process to the pixel defining layer 8 to thereby form a plurality of openings 9 (the intermediate product after this embodiments of the step is illustrated in FIG. 5C).

Figure 5D:
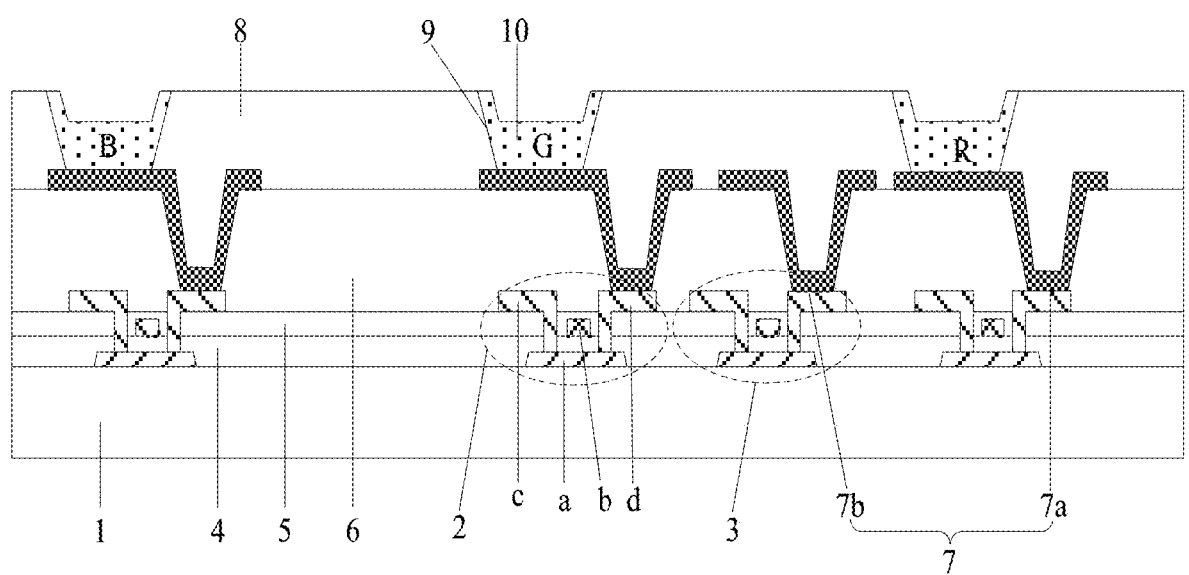
Figure 5E:
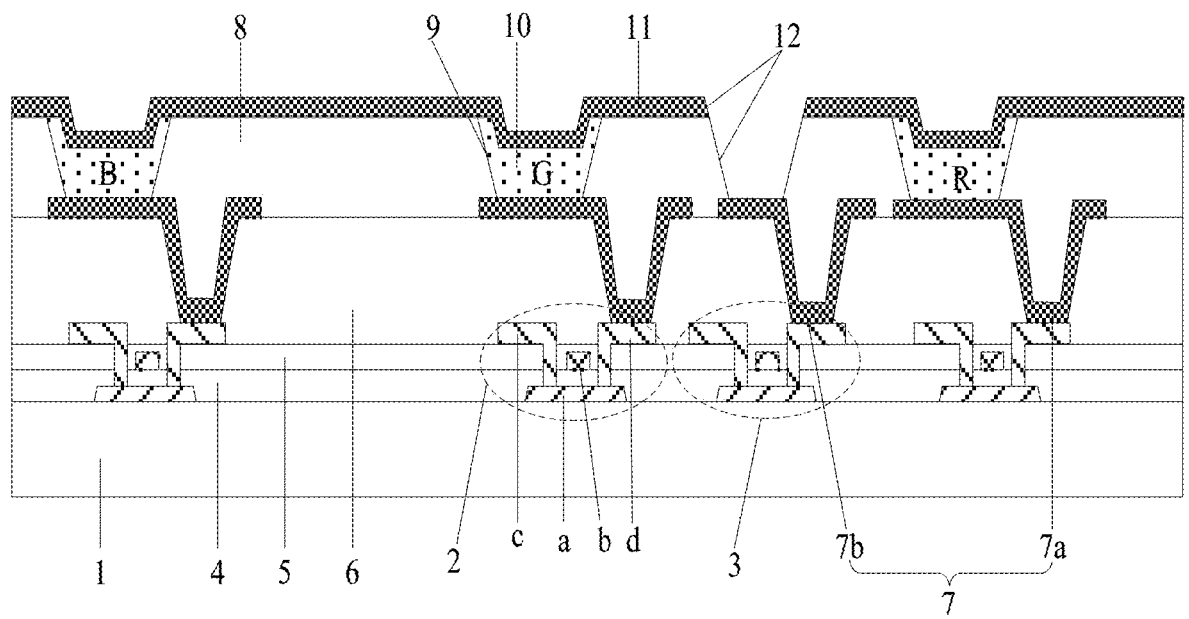

S130: forming a plurality of light-emitting members 10 in the plurality of openings 9 (the intermediate product after this embodiments of the step is illustrated in FIG. 5D);

S140: forming a first electrode layer 11 over a side of the plurality of light-emitting members 10 distal to the substrate; forming at least one first via 12 in the first electrode layer 11 and the pixel defining layer 8 such that each of the at least one first via 12 positionally corresponds to one of the at least one sensing thin-film transistor 3 1 (the intermediate product after this embodiments of the step is illustrated in FIG. 5E).

Figure 5F:
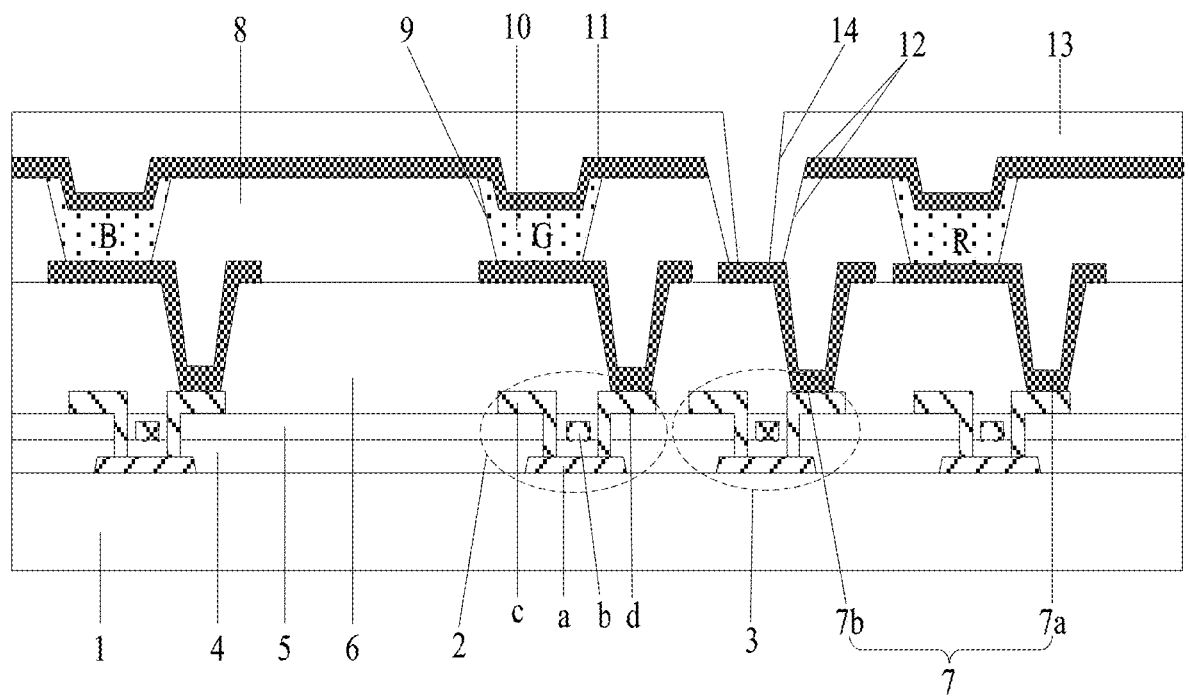

S200: forming a packaging layer 13 over a side of the at least one sensing thin-film transistor 3 distal to the substrate 1 (the intermediate product after this embodiments of the step is illustrated in FIG. 5F).

Optionally, the step S200 further comprises:

Forming at least one second via 14 in the packaging layer 13, wherein each of the at least one second via 14 positionally corresponds to the one of the at least one sensing thin-film transistor 3, and further forms a via-in-via structure with a corresponding first via 14 (the intermediate product after this embodiments of the step is also illustrated in FIG. 5F)

Figure 5G:
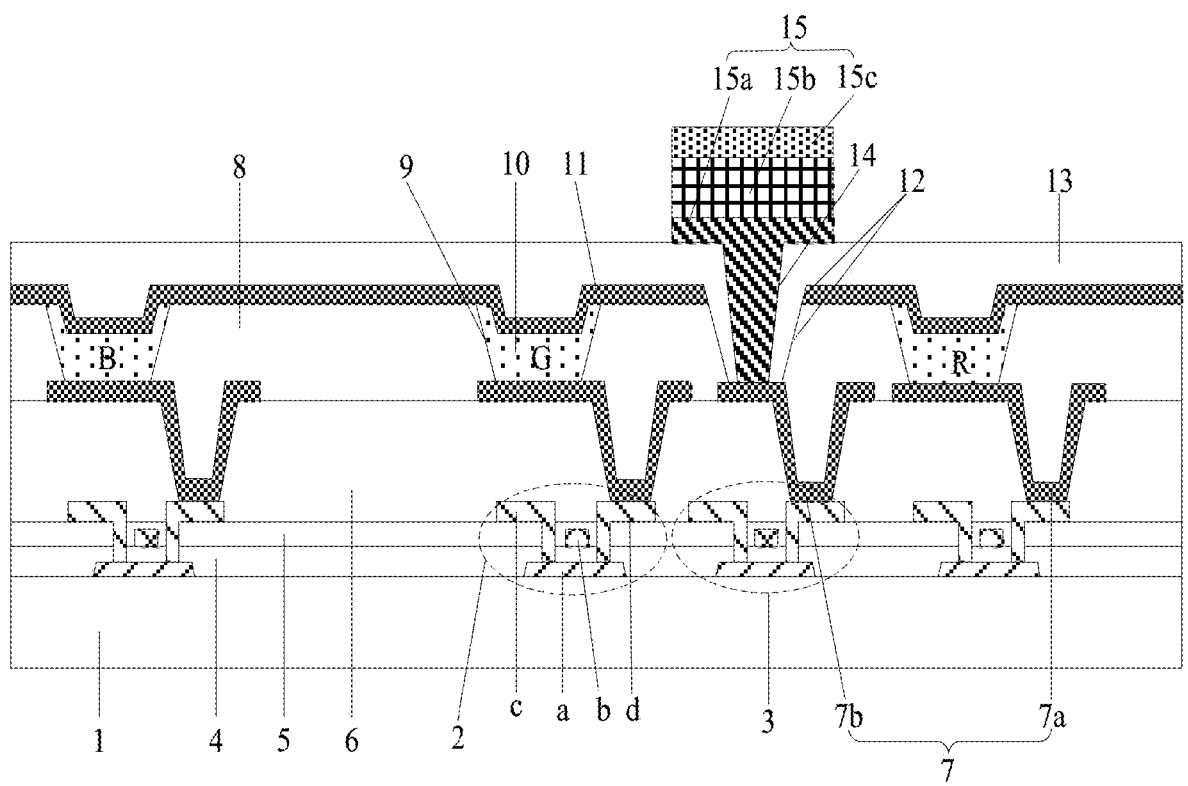

S300: forming at least one sensing unit 15 over a side of the packing layer 13 distal to the substrate 1, wherein each of the at least one sensing unit 15 is electrically coupled to one of the at least one sensing thin-film transistor 3 corresponding thereto to thereby form one sensor (the intermediate product after this embodiments of the step is also illustrated in FIG. 5G).

In the above step S300, each of the at least one sensing unit 15 can be electrically coupled to one of the at least one sensing thin-film transistor 3 corresponding thereto through a corresponding second via 14. Further by means of the via-in-via structure formed between corresponding first vias 14 and second vias 12, the sensing unit 15 of each of the at least one sensor 16 is electrically insulated from the first electrode layer 11.

Further in the above step S300, each of the at least one sensing unit 15 can be electrically coupled to a corresponding connecting electrode 7b through a corresponding second via 14. Because each connecting electrode 7b is electrically coupled to a corresponding sensing thin-film transistor 3, an indirect electrical coupling between each of the at least one sensing unit 15 and a corresponding sensing thin-film transistor 3 can be realized thereby.

With further reference to FIG. 5G, the step S300 of forming at least one sensing unit 15 over a side of the packing layer 13 distal to the substrate 1 can optionally include the following sub-steps:

S310: forming at least one third electrode 15a over a side of the packaging layer 13 distal to the substrate 1, wherein each of the at least one third electrode 15a is electrically coupled to a corresponding sensing thin-film transistor.

S320: forming at least one active portion 15b over a side of the at least one third electrode 15a distal to the substrate 1, wherein at least one active portion 15b corresponds to the at least one third electrode 15a.

S330: forming at least one fourth electrode 15c over a side of the at least one active portion 15b distal to the substrate 1, wherein at least one fourth electrode 15c correspond to at least one active portion 15b.

Herein, with regard to each sensing unit 15, at least one of the third electrode 15a, the active portion 15b, and the fourth electrode 15c can have a composition of an organic material. If an organic material is employed for the manufacturing of the array substrate, the manufacturing can be realized by a manufacturing process with a relatively low operational temperature, such as ink printing, printing, embossing, spraying, spin coating, or other film forming processes. As such, an adverse effect of a high temperature to the at least one light-emitting member 10 can be effectively avoided, and the manufacturing employing these above sub-steps has a relatively lower manufacturing cost compared with the manufacturing employing photoresists.

In a third aspect, the present disclosure further provides a display apparatus.

Figure 6:
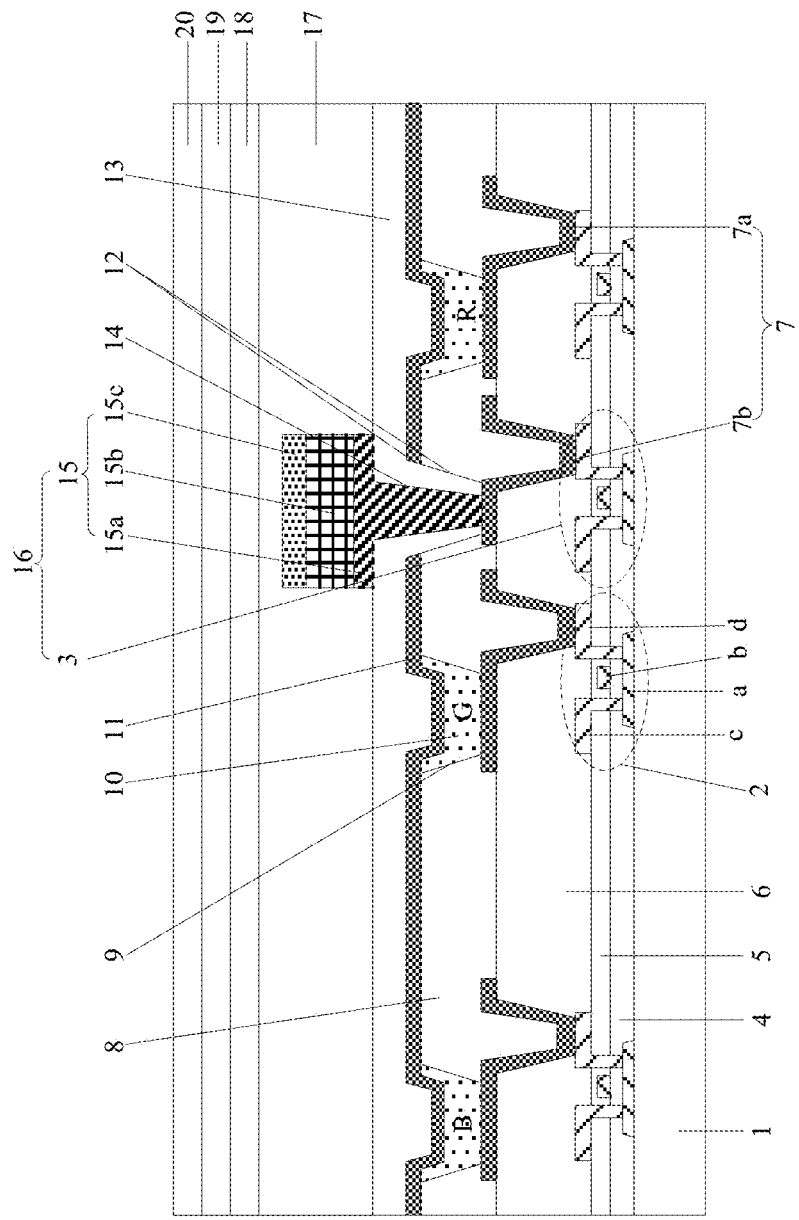
FIG. 6 illustrates a cross-sectional view of a display apparatus according to some embodiments of the disclosure.

The display apparatus comprises an array substrate according to any one of the embodiments as described above. FIG. 6 illustrates a cross-sectional view of a display apparatus according to some embodiments of the disclosure.

As shown in FIG. 6, the display apparatus comprises an array substrate. The array substrate includes at least one sensor 16. Each of the at least one sensor 16 comprises a sensing thin-film transistor 3 and a sensing unit 15, electrically coupled with each other. The sensing thin-film transistor 3 is arranged between a substrate 1 and a packaging layer 13, whereas the sensing unit 15 is arranged over a side of the packaging layer distal to the substrate 1.

As such, the space for configuring the at least one sensor 16 can be increased to cause a reduced manufacturing difficulty, and a thickness of the display apparatus can also be reduced.

Herein the display apparatus can be applied in an OLED display apparatus or a QLED display apparatus. FIG. 6 further illustrates one specific embodiment of the display apparatus, which further includes, in addition to the film layers as described above, a third insulating layer 17, a polarization layer 18, an optical film layer 19, and a protection layer 20. These film layers (i.e. the third insulating layer 17, the polarization layer 18, the optical film layer 19, and the protection layer 20) are sequentially stacked over each other and over a side of the packaging layer 13 distal to the substrate 1.

Accordingly, these film layers (i.e. the third insulating layer 17, the polarization layer 18, the optical film layer 19, and the protection layer 20) are sequentially formed after the formation of the at least one sensing unit 15.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
a substrate;
a packaging layer over the substrate; and
at least one sensor, each comprising a sensing thin-film transistor and a sensing unit electrically coupled with each other, wherein:
the sensing thin-film transistor is arranged between the package layer and the substrate; and
the sensing unit is arranged over a side of the package layer away from the substrate;
the array substrate further comprising:
a plurality of display thin-film transistors, wherein the sensing thin-film transistor in the each of the at least one sensor is arranged at substantially same film layers as each of the plurality of display thin-film transistors; and
sequentially over a side of the plurality of display thin-film transistors and the sensing thin-film transistor in the each of the at least one sensor away from the substrate and below the packaging layer:
a passivation layer;
a second electrode layer;
a pixel defining layer; and
a first electrode layer.

2. The array substrate of claim 1, wherein the sensing thin-film transistor in the each of the at least one sensor is of a substantially same structure and of a substantially same type as each of the plurality of display thin-film transistors.

3. The array substrate of claim 1, further comprising a plurality of display thin-film transistors, wherein the sensing thin-film transistor in the each of the at least one sensor is arranged at different film layers as each of the plurality of display thin-film transistors.

4. The array substrate of claim 1, wherein the sensing thin-film transistor in the each of the at least one sensor comprises an oxide thin-film transistor, and each of the plurality of display thin-film transistors comprises a low-temperature polysilicon thin-film transistor.

5. The array substrate of claim 1, wherein:
at least one first via is arranged in the pixel defining layer and the first electrode layer, corresponding to the at least one sensor respectively;
at least one second via is arranged in the passivation layer, corresponding to the at least one first via respectively;
wherein:
each of the at least one second via forms a via-in-via structure inside a corresponding first via; and
the sensing unit and the sensing thin-film transistor in the each of the at least one sensor are electrically coupled to each other through one of the at least one second via corresponding thereto.

6. The array substrate of claim 5, wherein each of the at least one first via and a corresponding second via is configured to extend through the passivation layer such that a direct electrical connection between a sensing unit and a sensing thin-film transistor of a corresponding sensor is realized.

7. The array substrate of claim 5, wherein the second electrode layer comprises at least one connecting electrode corresponding to the at least one sensor respectively, wherein:
each of the at least one connecting electrode is electrically coupled with a sensing thin-film transistor in a corresponding sensor through a third via in the passivation layer; and
each of the at least one first via and a corresponding second via is configured to allow an electrical connection between a sensing unit in a corresponding sensor and a corresponding connecting electrode.

8. The array substrate of claim 1, wherein the packaging layer comprises a thin film encapsulation (TFE) layer.

9. The array substrate of claim 1, wherein the sensing unit of the each of the at least one sensor comprises a third electrode, an active portion, and a fourth electrode, sequentially disposed over a side of the passivation layer distal to the substrate, wherein the third electrode is electrically coupled to the sensing thin-film transistor in the each of the at least one sensor.

10. The array substrate of claim 1, wherein the sensing unit in the each of the at least one sensor is transparent.

11. The array substrate of claim 10, wherein the sensing unit in the each of the at least one sensor is arranged in an area overlapping with a pixel area.

12. The array substrate of claim 1, wherein a sensing unit in one or more of the at least one sensor is non-transparent, and is arranged in a non-pixel area.

13. A display apparatus, comprising an array substrate according to claim 1.

14. An array substrate, comprising:
a substrate;
a packaging layer over the substrate; and
at least one sensor, each comprising a sensing thin-film transistor and a sensing unit electrically coupled with each other, wherein:
the sensing thin-film transistor is arranged between the package layer and the substrate; and
the sensing unit is arranged over a side of the package layer away from the substrate;
wherein the sensing unit of the each of the at least one sensor comprises a third electrode, an active portion, and a fourth electrode, sequentially disposed over a side of the passivation layer distal to the substrate, wherein the third electrode is electrically coupled to the sensing thin-film transistor in the each of the at least one sensor; and
wherein an orthographic projection of the third electrode on the substrate and an orthographic projection of the fourth electrode on the substrate stagger from each other.

15. The array substrate of claim 14, wherein the orthographic projection of the third electrode on the substrate and the orthographic projection of the fourth electrode on the substrate take a cross-finger shape.

16. A method for manufacturing an array substrate, comprising:
forming at least one sensing thin-film transistor over a substrate;
forming a packaging layer over a side of the at least one sensing thin-film transistor distal to the substrate; and
forming at least one sensing unit over a side of the packing layer distal to the substrate, wherein each of the at least one sensing unit is electrically coupled to one of the at least one sensing thin-film transistor corresponding thereto to thereby form one sensor;
wherein the at least one sensing unit comprises a third electrode, an active portion, and a fourth electrode, sequentially disposed over a side of a passivation layer distal to the substrate, wherein the third electrode is electrically coupled to the one of the at least one sensing thin-film transistor; and
wherein an orthographic projection of the third electrode on the substrate and an orthographic projection of the fourth electrode on the substrate stagger from each other.

17. The method of claim 16, wherein the forming at least one sensing thin-film transistor over a substrate comprises:
forming the at least one sensing thin-film transistor and a plurality of display thin-film transistors simultaneously over the substrate.

18. The method of claim 16, wherein the forming at least one sensing thin-film transistor over a substrate comprises:
forming the at least one sensing thin-film transistor and a plurality of display thin-film transistors separately over the substrate.

* * * * *